Oct. 20, 1970 J. H. TEAF 3,534,618
PUSHBUTTON TUNING MECHANISM WITH EXPANDABLE OUTER MEMBERS FOR ALIGNMENT
Filed April 11, 1969 3 Sheets-Sheet 1
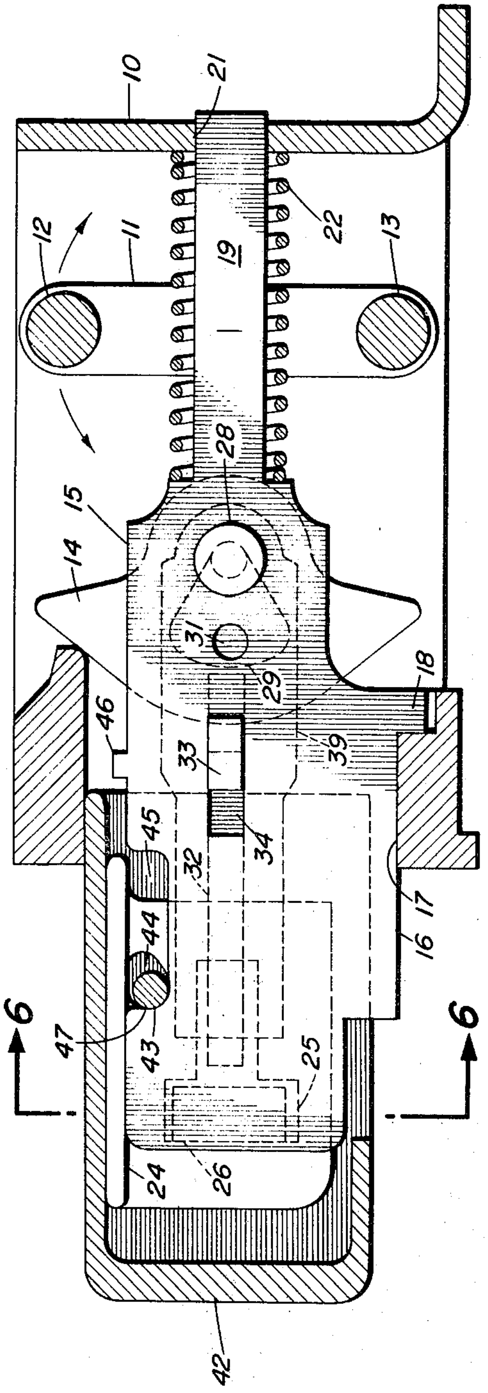
FIG. 2. UNLOCKED FOR RESET
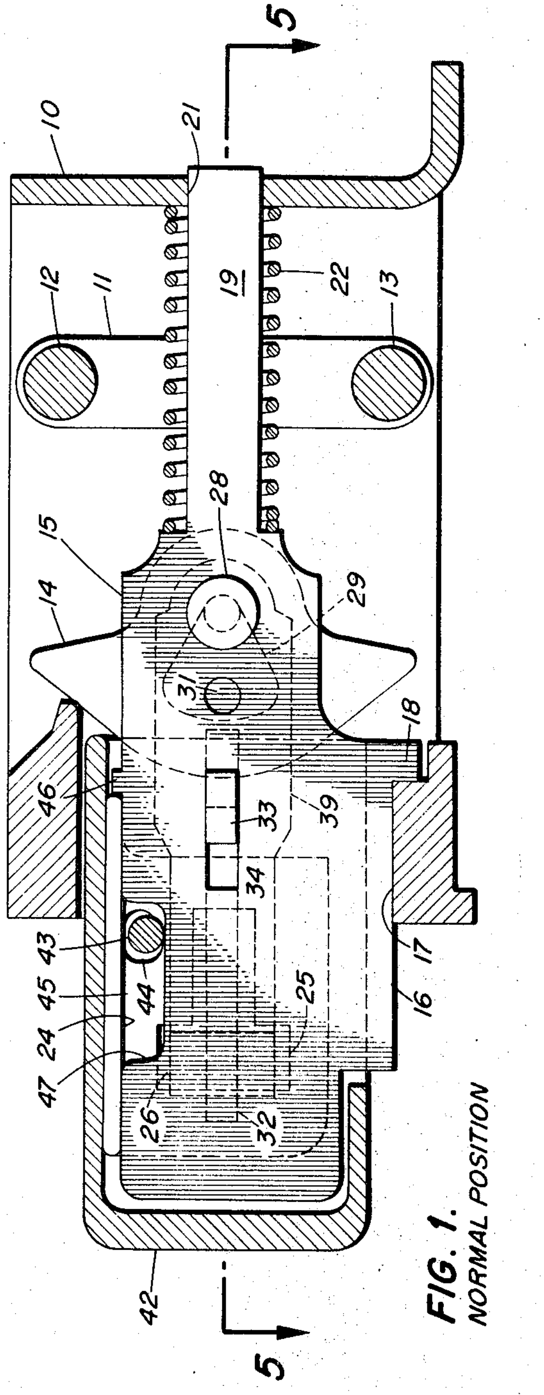
FIG. 1. NORMAL POSITION
INVENTOR
JOHN H. TEAF
BY Bruce L. Lamb
ATTORNEY

DEPRESSED POSITION

INVENTOR
JOHN H. TEAF
BY Bruce L. Lamb
ATTORNEY

Oct. 20, 1970 J. H. TEAF 3,534,618

PUSHBUTTON TUNING MECHANISM WITH EXPANDABLE OUTER MEMBERS FOR ALIGNMENT

Filed April 11, 1969 3 Sheets-Sheet 3

INVENTOR
JOHN H. TEAF

BY

ATTORNEY 3,534,618

PUSHBUTTON TUNING MECHANISM WITH EXPANDABLE OUTER MEMBERS FOR ALIGNMENT

John Howard Teaf, Towson, Md., assignor to The Bendix Corporation, a corporation of Delaware Filed Apr. 11, 1969, Ser. No. 815,441
Int. Cl. F16n *35/18*
U.S. Cl. 74—10.33 12 Claims

ABSTRACT OF THE DISCLOSURE

The invention provides means for reducing the effects of manufacturing tolerances on the tuning accuracy of pushbutton tuners. The pushbutton and tuning slide are linked together so that pressure on the pushbutton causes the button and slide to diverge towards opposite support members and absorb the normal clearances during inward travel.

The present invention relates to pushbutton tuning mechanisms for radios. It is particularly directed to means for maintaining tuning accuracy in a mechanism of drastically reduced size without imposing severe tolerances in manufacture.

This invention is an improvement over pushbutton tuning mechanisms of the type widely used in automobile radio receivers. Descriptions of mechanisms in common use are to be found in such U.S. patents as Nos. 2,489,544 to Schwarz et al.; 2,301,090, 2,928,283 and 2,273,499 to Teaf, the present inventor, and 2,367,860 to Gersch. These mechanisms are generally characterized as including a pivoted treadle bar which is linked to a carriage mounting the movable elements of the tuning reactors of the receiver. Manual tuning means, usually including a knob, are linked to the treadle or the carriage for manual adjustment of the receiver tuning. Pushbutton adjustment of the receiver tuning is accomplished by depressing a button which is either directly connected or proximately linked to a tuning slide. The tuning slide reciprocates within fixed guideways to carry a preadjusted cam into contact with the treadle bar and thereby rock the bar into a position constrained by the cam and which corresponds to a preset tuning adjustment of the receiver. The pushbutton, slide and cam are arranged so that the cam can be released from a position locked to the slide by manipulation of the pushbutton, usually, by withdrawing the button beyond its normal rest position. Upon next depressing the button, the cam is free to assume a new angular position relative to the slide until such position is constrained by the treadle bar, whereupon further motion of the button and slide again locks the cam to the slide. In this manner, the pushbutton tuning mechanisms are very readily adjusted to new station settings, a feature highly desirable in mobile radio apparatus.

The present invention retains these general features of the art. The distinction immediately apparent between this invention and other known mechanisms of the sort described above is that the length of the present mechanism is considerably compressed from that of the former (to as much as one-third of the former). This compression cannot be achieved by a simple reduction in lengths or a repositioning of the elements of the mechanism when normal manufacturing tolerances are involved because such a compression magnifies the effect of manufacturing tolerances upon the tuning accuracy of the mechanism. For example, prior mechanisms made with normal tolerances are capable of repeatably tuning to within 500 to 3000 cycles of the desired station carrier, an acceptable range, whereas it is calculated that reducing the length of such a mechanism while maintaining the same or more liberal tolerances commensurate with choices of different materials would result in tuning errors of about 12,000 to 30,000 cycles, or more than assigned channel widths of one to three AM broadcast stations. It is not proposed to demonstrate rigorously the existence of such an increase in tuning error, but the calculation can be verified on the assumption that the dimensions of the cam, treadle bar and pushbutton are the same and further that the reduction in slide length is such that the slide can only be supported in series with or by the button itself, since the pushbutton must travel over the former outboard support of the slide.

It is therefore the principal object of the present invention to provide a pushbutton tuning mechanism retaining the advantages of the above described art and further possessing a drastically reduced length thereby permitting a marked overall reduction in the size of the radio receiver in which it is incorporated.

While embraced generally in the foregoing, it is a further object of the invention to provide a pushbutton tuning mechanism of shortened or compressed length, manufactured with normal tolerances, and which entails no sacrifice in tuning accuracy when compared with prior mechanisms.

Another object is to provide a tuning mechanism a large part of which may be fabricated from non-precision cast metal or plastic parts and which is further simplified by the elimination of metal inserts in plastic parts which otherwise might be required for strength or wear resistance.

Still another object is to provide a pushbutton tuning mechanism in which tuning accuracy is maintained by absorbing clearances through a wedging action and in which this action is caused to occur prior to tuning action and prior to readjustment of a new tuning position.

Briefly, the present invention accomplishes critical alignment of the tuner slide by causing a pushbutton surface to engage a rigid surface of the frame of the mechanism and a surface of the slide to engage another opposed surface of the frame to provide a fixed reference supporting the outboard end of the slide. The button and slide are linked together so that they will expand or tend to move away from one another upon depressing the button thereby taking-up the clearance between the pushbutton, slide, and frame which is normally present, and desired, both for ease of manufacture, and for smoothness of operation of the mechanism on the return stroke.

In the drawings:

FIG. 1 is an elevation of the invention partly in section showing the cam locked and the pushbutton in its normal rest position;

FIG. 2 is view similar to FIG. 1 except that the parts are shown in the unlocked position of the cam;

Figure 5:
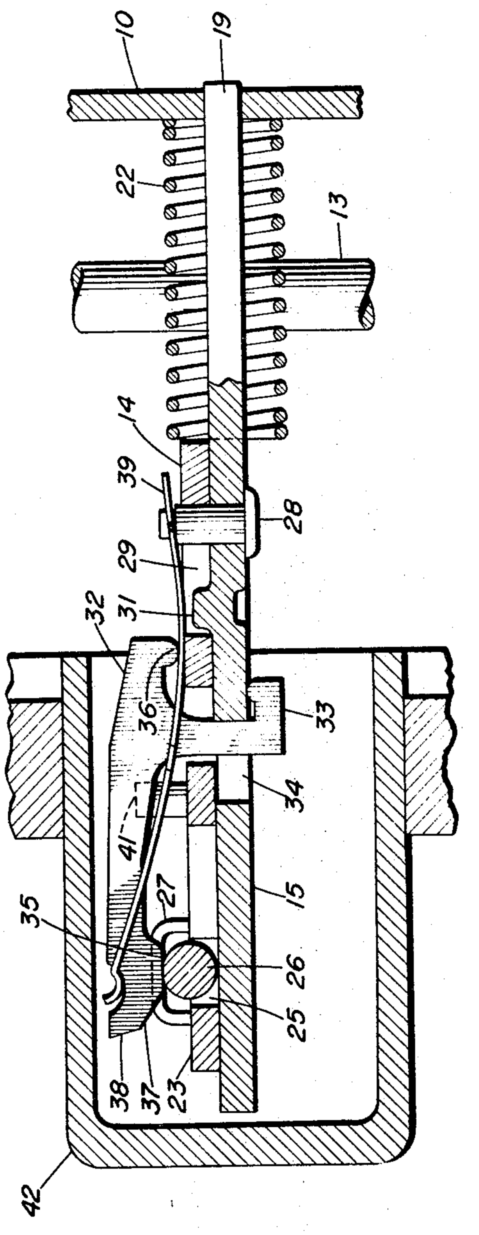
Figure 4:
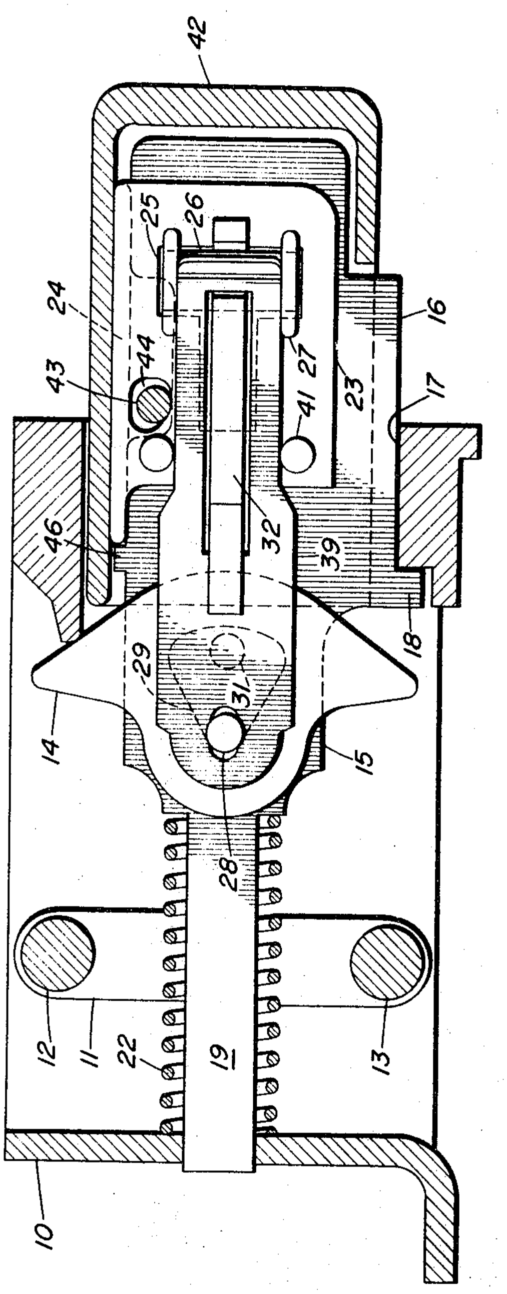
FIG. 4 is an elevation of the face opposite that shown in FIG. 1.
Figure 4A:
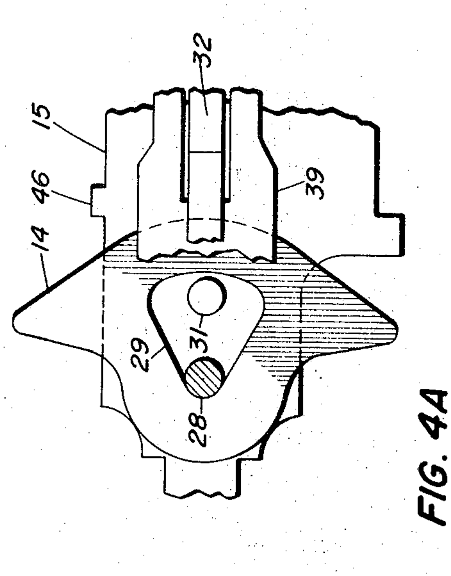

FIG. 4*a* is a view similar to FIG. 4 with portions thereof broken away to show details of the cam and mounting;

FIG. 5 is a top section taken along the line 5—5 of FIG. 1; and

Figure 6:
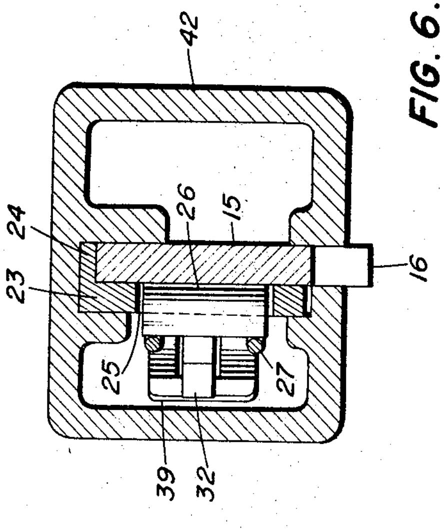

FIG. 6 is an end section along the line 6—6 of FIG. 2.

Referring to FIGS. 1, 4, and 5, and first to FIG. 1, showing the pushbutton in its normal rest position. Conventional parts of the tuning mechanism have been omitted from the drawing but it will be understood that a unitary frame 10 supports a pivotally mounted treadle bar 11 joined by two horizontal rods 12 and 13 to a similar bar (not shown) on the opposite side of the frame. Also not shown, but understood to be included, are the manual tuning means and the carriage mounting movable elements of the tuning reactors. A number of pushbuttons, only one of which appears in the drawings, are arranged side by side to reciprocate between rods 12 and 13 and thus allow the selection of an equal number of preset stations. The description of one such mechanism is sufficent for an understanding of the invention.

A cam 14 is pivotally mounted on a tuning slide 15 and locked on a fixed angular relationship thereto by means later described. Slide 15 is shaped with a dependent lower portion 16 which moves within a groove 17 in the outer portion of the tuner frame. A stop tab 18 extends below portion 16 to engage the tuner frame and limit the return travel of the slide. A tang 19 forms the inner end of slide 15 and extends through a slot 21 in the inner rear wall of the tuner frame. A spring 22 carried by tang 19 urges the slide and the elements carried thereby outwardly until stop 18 engages the frame to limit further outward travel.

Figure 3:
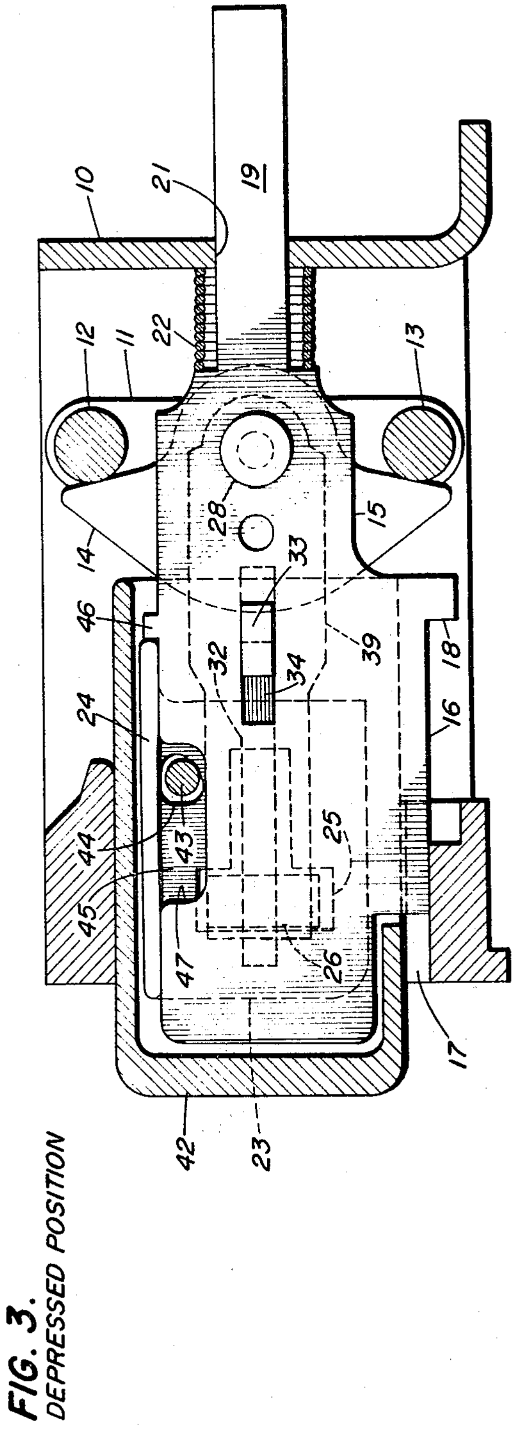
FIG. 3 is a view similar to FIG. 1 except that the parts are shown in the positions occupied when the button is fully depressed.

Referring briefly to FIG. 3, when the button is depressed in tuning a station, slide 15 is driven inwardly until both the upper and lower lobes of cam 14 are in engagement with rods 12 and 13. The inward motion of the slide is thereupon limited and if in the course of its inward travel, the upper lobe of cam 14 should first encounter rod 12, treadle bar 11 will be rocked in a clockwise direction until rod 13 encounters the lower lobe of cam 14 thus adjusting the tuning of the receiver as in prior mechanisms.

Referring to FIGS. 4, 5 and 6, the cam locking means will be described. A shuttle plate 23 is provided with an overturned lip 24 which rests on the upper surface of the outer end of slide 15. Towards the outer end of shuttle 23 is a rectangular slot 25 in which a roller 26 is captured on one side by loops 27 on the shuttle and on the other side by the facing surface of slide 15. A stud 28 is formed towards the middle of slide 15. As best seen in FIG. 4*a* this stud extends through a segmental opening 29 in the cam 14. The sloping sides of opening 29 tend to center cam 14 accurately upon stud 28 when the cam is unlocked for resetting a new tuning position and both upper and lower lobes of cam 14 are under pressure from rods 12 and 13. A detent projection 31 which does not extend above the surface of cam 14, limits the angular motion of the unlocked cam so that it can not fall into an over center position making movement of the cam impossible. Referring to FIG. 5, a locking lever 32 having a hook shaped fulcrum 33 extending through a slot 34 in slide 15 bears through point 36 at its one end upon cam 14 and at its other end upon roller 26. The end of lever 32 bearing on roller 26 is shaped to contact the roller in different planes. In the position shown in FIG. 5 the edge 35 is inclined at a slight backrake to provide a detent force great enough to prevent cam 14 from becoming unlocked by vibration or shock during return motion of the slide and pushbutton. When an above normal force is applied to withdraw the pushbutton from the locked position of FIG. 2, movement of shuttle 23 causes roller 26 to move out of contact with edge 35 and bear next on edge 37 and finally rest in loose contact with edge 38. In this unlocked position pressure is completely released upon point 36 and the cam 14 can be rotated freely. As thus far described cam, shuttle, lever, roller and slide can all be readily disassembled. To secure the assembly and to provide forces later described, an elongated slotted spring member 39, best seen in FIG. 4, is secured at its end adjacent to cam 14 by a hole engaged over a trunnion forming a part of stud 28 and passes between two aligning pins 41 on shuttle 23 to hook in a notch on the outer end of lever 32 near edge 35. Fulcrum 33 of lever 32 pass through the slot in spring 39 thus interposing a portion of the spring between the end of lever 32 and cam 14. Spring 39 thus forces lever 32 into a position relieving pressure on cam 14 when shuttle 23 is withdrawn to the unlocked position. At the same time the spring applies force to the outer end of lever 32 to maintain contact with roller 26 and further secures all parts in an assembled relationship.

Again referring to FIGS. 1, 2 and 3, a rectangular box-like pushbutton, having a slot in its lower side through which extends the lower portion 16 of slide 15, encloses the outer portions of the mechanism above described. A drive pin 43 extends between the upper edges of the side walls of pushbutton 42 through an inclined slot 44 in shuttle 23 and passes above slide 15 within the clearance space 45 provided therein. Thus, pushbutton 42 is rather loosely linked to shuttle 23 and provides thrust to slide 15 only through the action of the shuttle. The pushbutton may move vertically with respect to the shuttle and the slide within the limits of slot 44. In the normal position of FIG. 1, pin 43 tends to rest in the bottom of slot 44 while a slight amount of clearance exists between the top side of the pushbutton and the frame. The lower portion 16 of slide 15 rests under the weight of the mechanism upon the frame. When the button is depressed, as in FIG. 3, assuming the cam to be locked in a previously selected tuning position so that shuttle and slide travel together without relative movement, inward motion of the slide is initially resisted by spring 22 causing pin 43 to tend to ascend the incline of slot 44 and commence closure of the clearances. When cam 14 contacts one of the rods 12 or 13 the resistance to inward motion of the mechanism increases causing pin 43 further to ascend the incline of slot 44, while the reaction of pin 43 on the contacting surface of this slot produces a downward thrust upon the shuttle which forces both shuttle and slide downward until all clearance is taken up between the lower edge 16 of the slide and the lower supporting frame member and between the upper surface of the pushbutton and the upper frame member. In this manner the outboard end of the pushbutton mechanism is accurately aligned at the beginning of the tuning operation and continues to remain so during the balance of the inward travel of the mechanism.

In resetting the mechanism for the adjustment of a new tuning position, the pushbutton is withdrawn from the position of FIG. 1 to that of FIG. 2. In the withdrawal pin 43 descends the incline of slot 44 restoring the clearances about the button and slide and as the pin reaches the lower end of the slot shuttle 23 offers resistance to further outward movement because of the detenting action of edge 35 of lever 32. This detenting action, of course, prevents relative movement between the shuttle and slide on the return stroke of the mechanism in normal tuning operation. When sufficient force is applied to the pushbutton to overcome the detenting action, shuttle 23 is carried outwardly, moving roller 26 along edges 37 and 38 of lever 32 until pin 43 encounters the upstanding outer edge 47 of clearance space 45. Further outward movement of the pushbutton is arrested and cam 14 is unlocked. When pressure is applied to depress the pushbutton from the unlocked position, inward motion of the shuttle is initially resisted by the effect of the force of spring 39 acting on the outer end of lever 32 and edge 38 which is nearly normal to the direction of shuttle motion. This provides a resistance to premature cam lock-up causing pin 43 first to ascend the incline of slot 44 until both top and bottom clearances are removed before any motion of the shuttle occurs. The mechanism continues to travel inwardly, now with the outboard end accurately aligned with the frame until one of the lobes of cam 14 encounters one of the rods 12 or 13. With continuing inward travel of the mechanism, cam 14 is rotated to its newly desired position in contact with both rods 12 and 13 whereupon a marked increase in the resistance to inward thrust occurs. The inward thrust is then applied towards overcoming the resistance of spring 39 and edge 38 and causes shuttle 23 to move inwardly and carry roller 26 into contact with lever edge 37. The gentler slope of edge 37 eases the stressing of lever 32 and applies a gradually increasing locking pressure through point 36 upon cam 14. Finally roller 26 passes out of contact with edge 37 and into contact with edge 35. When the leading edge of shuttle lip 24 encounters abutment 46 further inward motion of the mechanism is arrested and the cam is then locked in the new wedged, tuned and locked position.

The invention claimed is:

1. A pushbutton mechanism capable of repeatably accurate reciprocating motion comprising
- a reciprocating slide;
- support members spaced opposite one another at one end of said slide;
- a pushbutton adjacent said one end of said slide and arranged to travel between said support members;
- means including an incline coupling said pushbutton to said slide, said incline being arranged to provide components of force, when thrust is applied to said pushbutton, directed towards said support members to cause divergent movement of said pushbutton and said slide so that said pushbutton will be forced against one of said support members while said slide is forced against the other of said support members.

2. A mechanism as claimed in claim 1 with additionally a cam pivotally mounted on said slide, and wherein said coupling means includes means for locking said cam to said slide.

3. A mechanism as claimed in claim 2 wherein said pushbutton surrounds and substantially encloses said cam locking means.

4. A mechanism as claimed in claim 1 wherein said pushbutton includes a flat surface adjacent said one support member.

5. A pushbutton tuning mechanism comprising
- a slide;
- an adjustable tuning cam pivotally mounted on said slide;
- a first support member at one end of said slide and across which said slide reciprocates a shuttle adjacent said one end of said slide and movable relative to said slide, said shuttle including an inclined surface providing a component of force, when force is directed against said incline, to cause said shuttle to bear on said slide to move said slide into engagement with said first support member;
- a second support member spaced opposite from said first support member;
- a pushbutton adjacent said second support member and superposed with respect to said one end of said slide;
- means coupling said pushbutton to the inclined surface of said shuttle so that application of thrust to said pushbutton will cause said slide to move towards said first support member and said pushbutton to move towards said second support member; and
- means controlled by said shuttle for locking said tuning cam in a fixed position relative to said slide.

6. A mechanism as claimed in claim 5 wherein said pushbutton substantially surrounds and encloses said shuttle and said one end of said slide.

7. A mechanism as claimed in claim 5 wherein said shuttle includes a surface bearing on an edge of said slide opposite said first support means and said inclined surface is comprised by an inclined slot in said shuttle.

8. A mechanism as claimed in claim 7 wherein said means coupling said pushbutton to said shuttle comprises a pin clearing said slide and passing through said inclined slot.

9. A mechanism as claimed in claim 5 wherein said tuning cam locking means comprises a lever fulcrumed on said slide and having one end bearing on said tuning cam and having a cammed surface at the other end adjacent said shuttle for applying variable pressure to said tuning cam according to the position of said shuttle.

10. A mechanism as claimed in claim 9 wherein said tuning cam locking means includes a roller carried by said shuttle and bearing on the cammed surface of said lever.

11. A mechanism as claimed in claim 10 wherein said cammed surface of said lever includes a first surface for locking said lever when said roller is in contact therewith; a second surface contiguous to said first surface for applying a variable force to said lever according to the position of roller contact with said second surface and a third surface contiguous to said second surface to resist, when said roller is in contact therewith, motion of said shuttle during readjustment of said tuning cam.

12. A mechanism as claimed in claim 9 wherein the cammed surface of said lever is shaped to provide a force resisting return motion of said shuttle, when said shuttle is moved to a position releasing pressure on said tuning cam, whereby thrust applied to said pushbutton will cause said slide to engage said first support member and said pushbutton to engage said second support member before causing return motion of said shuttle.

References Cited

UNITED STATES PATENTS

| | | | |
|---|---|---|---|
| 2,928,283 | 3/1960 | Teaf | 74—10.33 |
| 3,403,564 | 10/1968 | Ohashi | 74—10.33 |

MILTON KAUFMAN, Primary Examiner

U.S. Cl. X.R.

334—7